(12) United States Patent
Choi et al.

(10) Patent No.: US 10,651,255 B2
(45) Date of Patent: May 12, 2020

(54) THIN FILM TRANSISTOR AND METHOD OF MANUFACTURING THE SAME

(71) Applicant: Samsung Electronics Co., Ltd., Suwon-si, Gyeonggi-do (KR)

(72) Inventors: Ajeong Choi, Suwon-si (KR); Suk Gyu Hahm, Gyungju-si (KR); Jeong Il Park, Seongnam-si (KR); Yong Uk Lee, Gwangju-si (KR); Jong Won Chung, Hwaseong-si (KR)

(73) Assignee: Samsung Electronics Co. Ltd., Gyeonggi-do (KR)

( * ) Notice: Subject to any disclaimer, the term of this patent is extended or adjusted under 35 U.S.C. 154(b) by 0 days.

(21) Appl. No.: 15/826,011

(22) Filed: Nov. 29, 2017

(65) Prior Publication Data
US 2019/0035868 A1   Jan. 31, 2019

(30) Foreign Application Priority Data
Jul. 27, 2017   (KR) .................. 10-2017-0095367

(51) Int. Cl.
*H01L 27/32*   (2006.01)
*H01L 51/00*   (2006.01)
(Continued)

(52) U.S. Cl.
CPC ....... *H01L 27/3262* (2013.01); *G09G 3/3233* (2013.01); *G09G 3/3283* (2013.01);
(Continued)

(58) Field of Classification Search
CPC ............ H01L 51/0035; H01L 51/0074; H01L 51/0071; H01L 51/0068; H01L 51/0545;
(Continued)

(56) References Cited

U.S. PATENT DOCUMENTS 6,278,127 B1 * 8/2001 Dodabalapur ......... B82Y 10/00
                                              257/40
7,772,055 B2   8/2010 Germain et al.
(Continued)

FOREIGN PATENT DOCUMENTS

EP    2 911 214 A1     8/2015
JP    2007-535178 A   11/2007
(Continued)

OTHER PUBLICATIONS

K. Nakayama, High-Mobility Organic Transistors with Wet-Etch-Patterned Top Electrodes: A Novel Patterning Method for Fine-Pitch Integration of Organic Devices, Advanced Materials Interfaces, 2014, 1-6, WILEY-VCH Verlag GmbH & Co. KGaA, Weinheim.
(Continued)

*Primary Examiner* — Shahed Ahmed
(74) *Attorney, Agent, or Firm* — Harness, Dickey & Pierce, P.L.C.

(57) ABSTRACT

Disclosed are a thin film transistor including a gate electrode, a semiconductor layer, a source electrode, and a drain electrode. The semiconductor layer overlaps the gate electrode. The source electrode and the drain electrode are electrically connected to the semiconductor layer. The semiconductor layer includes a first semiconductor layer including a first organic semiconductor material and a second semiconductor layer including a second organic semiconductor material. The second semiconductor layer is farther spaced apart from the gate electrode than the first semiconductor layer. A HOMO energy level of the second organic semiconductor material is different from a HOMO energy level of the first organic semiconductor material. A method of manufacturing the thin film transistor is disclosed.

21 Claims, 10 Drawing Sheets

(51) Int. Cl.
G09G 3/3233 (2016.01)
G09G 3/3283 (2016.01)
G09G 3/36 (2006.01)
H01L 51/05 (2006.01)

(52) U.S. Cl.
CPC ....... G09G 3/3685 (2013.01); H01L 27/3248 (2013.01); H01L 51/0074 (2013.01); H01L 51/0545 (2013.01); H01L 51/0562 (2013.01); H01L 2251/552 (2013.01); H01L 2251/554 (2013.01)

(58) Field of Classification Search
CPC ............. H01L 27/3262; H01L 27/3248; H01L 2021/775; H01L 27/1251; H01L 27/3274; H01L 51/0508–057; H01L 51/5296; H01L 27/283; G09G 3/3233; G09G 3/3283
See application file for complete search history.

(56) References Cited

U.S. PATENT DOCUMENTS

| 7,816,673 | B2 | 10/2010 | Park et al. | |
| 9,666,683 | B2 | 5/2017 | Chiu et al. | |
| 2003/0047729 | A1* | 3/2003 | Hirai | C23C 16/509 |
| | | | | 257/40 |
| 2003/0075715 | A1* | 4/2003 | Satoh | H01L 51/004 |
| | | | | 257/40 |
| 2006/0226005 | A1 | 10/2006 | Takagi et al. | |
| 2012/0313150 | A1 | 12/2012 | Katsuhara | |
| 2017/0084840 | A1* | 3/2017 | Nakayama | H01L 51/0003 |
| 2017/0170399 | A1* | 6/2017 | Masui | C08L 101/00 |
| 2017/0263729 | A1 | 9/2017 | Chiu et al. | |
| 2018/0138416 | A1* | 5/2018 | Seo | H01L 51/0072 |
| 2019/0036029 | A1* | 1/2019 | Tamakuni | H01L 29/786 |

FOREIGN PATENT DOCUMENTS

| KR | 1723540 | 3/2017 |
| KR | 2017-0042457 A | 4/2017 |
| WO | WO-2005-106927 A2 | 11/2005 |

OTHER PUBLICATIONS

Josh C. Bolinger, Light-assisted deep-trapping of holes in conjugated polymers, Feb. 3, 2009, 1342-1346, vol. 106 No. 5, PNAS.

Yamane et al., "Organic heterojunction ambipolar field effect transistors with asymmetric source and drain electrodes," ScienceDirect, Thin Solid Films 516, (2008), pp. 2758-2761.

Extended European Search Report for EP Appl. No. 18183064.7 dated Dec. 11, 2018.

* cited by examiner

THIN FILM TRANSISTOR AND METHOD OF MANUFACTURING THE SAME

This application claims priority under 35 U.S.C. § 119 to Korean Patent Application No. 10-2017-0095367 filed in the Korean Intellectual Property Office on Jul. 27, 2017, the entire contents of which are incorporated herein by reference.

BACKGROUND

1. Field

A thin film transistor and a method of manufacturing the same are disclosed.

2. Description of Related Art

A flat panel display such as a liquid crystal display (LCD), an organic light emitting diode (OLED) display, an electrophoretic display, and the like includes a pair of electric field-generating electrodes and an electrical optical active layer interposed therebetween. The liquid crystal display (LCD) includes a liquid crystal layer as an electric optical active layer, and the organic light emitting diode (OLED) display includes an organic emission layer as an electrical optical active layer.

One of the pairs of the electric field-generating electrodes is commonly connected to a switching device and receives an electrical signal, and the electrical optical active layer transforms the electrical signal into an optical signal and thus displays an image.

The flat panel display includes a three-terminal element of a thin film transistor (TFT) as a switch, and it also includes a gate line transferring a scan signal for controlling the thin film transistor and a data line transferring a data signal to be applied to a pixel electrode.

Among the thin film transistors, an organic thin film transistor (OTFT) including an organic semiconductor such as a low molecular compound or a polymer instead of the inorganic semiconductor such as silicon (Si) has been actively researched.

SUMMARY

Some example embodiments provide a thin film transistor capable of realizing improved performance.

Some example embodiments provide a method of manufacturing the thin film transistor.

According to some example embodiments, a thin film transistor includes a gate electrode, a semiconductor layer overlapping with the gate electrode, and a source electrode and a drain electrode that are electrically connected to the semiconductor layer. The semiconductor layer includes a first semiconductor layer and a second semiconductor layer. The first semiconductor layer includes a first organic semiconductor material. The second semiconductor layer is farther spaced apart from the gate electrode than the first semiconductor layer. The second semiconductor layer includes a second organic semiconductor material. A HOMO energy level of the second organic semiconductor material is different from a HOMO energy level of the first organic semiconductor material.

In some example embodiments, a HOMO energy level of the second organic semiconductor material may be higher than the HOMO energy level of the first organic semiconductor material.

In some example embodiments, a HOMO energy level of the second organic semiconductor material may be at least about 0.2 eV higher than the HOMO energy level of the first organic semiconductor material.

In some example embodiments, a HOMO energy level of the first organic semiconductor material may be about 4.8 eV to about 5.3 eV, and the HOMO energy level of the second organic semiconductor material may be about 5.2 eV to about 5.6 eV.

In some example embodiments, the first semiconductor layer may be thicker than the second semiconductor layer.

In some example embodiments, the source electrode and the drain electrode may contact an upper surface of the second semiconductor layer.

In some example embodiments, the thin film transistor may further include a gate insulating layer between the gate electrode and the semiconductor layer, and a lower surface of the first semiconductor layer may contact the gate insulating layer.

In some example embodiments, the first semiconductor layer and the second semiconductor layer may have a same planar shape.

In some example embodiments, a charge mobility of the first organic semiconductor material may be higher than a charge mobility of the second organic semiconductor material.

In some example embodiments, the first organic semiconductor material and the second organic semiconductor material may be each include a fused polycyclic heteroaromatic compound.

In some example embodiments, the fused polycyclic heteroaromatic compound of the first organic semiconductor material may include 8 or more fused rings and the fused polycyclic heteroaromatic compound of the second organic semiconductor material may include less than 8 fused rings.

According to some example embodiments, a method of manufacturing a thin film transistor includes forming a gate electrode, forming a semiconductor layer on the gate electrode, and forming a source electrode and a drain electrode connected to the semiconductor layer. The forming the semiconductor layer includes forming a first semiconductor layer including a first organic semiconductor material and forming a second semiconductor layer including a second organic semiconductor material on the first semiconductor layer, and a HOMO energy level of the first organic semiconductor material and a HOMO energy level of the second organic semiconductor material are different.

In some example embodiments, the HOMO energy level of the second organic semiconductor material may be higher than the HOMO energy level of the first organic semiconductor material.

In some example embodiments, the HOMO energy level of the second organic semiconductor material may be at least about 0.2 eV higher than the HOMO energy level of the first organic semiconductor material.

In some example embodiments, the HOMO energy level of the first organic semiconductor material may be about 4.8 eV to about 5.3 eV and the HOMO energy level of the second organic semiconductor material may be about 5.2 eV to about 5.6 eV.

In some example embodiments, the forming the source electrode and the drain electrode may be performed after the forming the semiconductor layer. The forming of the source electrode and the drain electrode may include forming a conductive layer on the second semiconductor layer and etching the conductive layer using an etching solution. The HOMO energy level of the second organic semiconductor material may be higher than an oxidation potential of the etching solution.

In some example embodiments, the HOMO energy level of the second organic semiconductor material may be higher than the oxidation potential of the etching solution and the HOMO energy level of the second organic semiconductor material may be less than or equal to about 5.6 eV.

In some example embodiments, the HOMO energy level of the first organic semiconductor material may be lower than the oxidation potential of the etching solution.

In some example embodiments, the HOMO energy level of the first organic semiconductor material may be higher than or equal to about 4.8 eV and the HOMO energy level of the first organic semiconductor material may be lower than the oxidation potential of the etching solution.

In some example embodiments, the forming of the semiconductor layer may include forming a first thin film for a first semiconductor layer, forming a second thin film for a second semiconductor layer, and etching the first thin film and the second thin film simultaneously.

According to some example embodiments, an electronic device includes the thin film transistor.

A thin film transistor having high performance may be realized.

DETAILED DESCRIPTION

Figure 1:
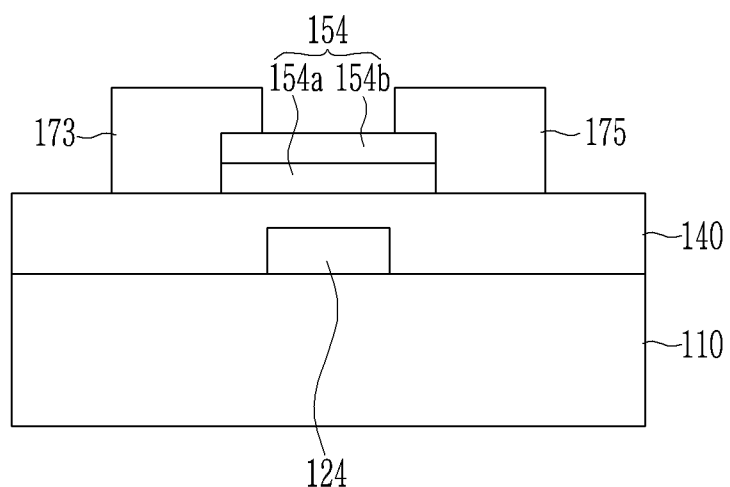
FIG. 1 is a cross-sectional view showing a thin film transistor according to some example embodiments.

Example embodiments will hereinafter be described in detail, and may be easily performed by those who have common knowledge in the related art. However, this disclosure may be embodied in many different forms and is not to be construed as limited to embodiments described herein.

When a definition is not otherwise provided, "substituted" refers to replacement of hydrogen of a compound by a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when specific definition is not otherwise provided, "hetero" refers to one including 1 to 3 heteroatoms selected from N, O, S, Se, and P.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a HOMO energy level is expressed as an absolute value from a vacuum level. In addition, when the HOMO energy level is said to be 'deep', 'high,' or 'large,' the HOMO energy level has a large absolute value based on '0 eV' of the vacuum level, while when the HOMO energy level is 'shallow', 'low,' or 'small,' the HOMO energy level has a small absolute value based on '0 eV' of the vacuum level.

Hereinafter, a redox potential is expressed as an absolute value. When the redox potential is described to be 'high' or 'large,' the redox potential has a large absolute value, while when the redox potential is described to be 'low' or 'small,' the redox potential has a small absolute value.

Hereinafter, a thin film transistor according to some example embodiments is described.

FIG. 1 is a cross-sectional view showing a thin film transistor according to some example embodiments.

Referring to FIG. 1, a thin film transistor according to some example embodiments includes a substrate 110, a gate electrode 124, a gate insulating layer 140, a semiconductor layer 154, a source electrode 173, and a drain electrode 175.

The substrate 110 may be for example a transparent glass, an insulation substrate such as polymer, or a silicon wafer. The polymer may include for example polyethylene terephthalate, polyethylene naphthalate, polycarbonate, polyacrylate, polyimide, or a combination thereof, but is not limited thereto.

The gate electrode 124 is formed on the substrate 110. The gate electrode 124 is connected to a gate line (not shown) transferring a gate signal. The gate electrode 124 may be for example made of gold (Au), copper (Cu), nickel (Ni), aluminum (Al), molybdenum (Mo), chromium (Cr), tantalum (Ta), titanium (Ti), an alloy thereof, or a combination thereof, but is not limited thereto. However, when the substrate 110 is a silicon wafer, the gate electrode 124 may be a doping region of the silicon wafer. The gate electrode 124 may include one layer or two or more layers.

A gate insulating layer 140 is formed on the gate electrode 124.

The gate insulating layer 140 may be made of an organic material or an inorganic material. Examples of the organic material may include a compound such as a polyvinyl alcohol-based compound, a polyimide-based compound, a polyacryl-based compound, a polystyrene-based compound, a benzocyclobutane (BCB), or a combination thereof and examples of the inorganic material may include a silicon nitride ($SiN_x$), a silicon oxide ($SiO_2$), aluminum oxide ($Al_2O_3$), or a combination thereof, but are not limited thereto. The gate insulating layer 140 may include for example one layer or two or more layers.

A semiconductor layer 154 is formed on the gate insulating layer 140.

The semiconductor layer 154 overlaps with the gate electrode 124 while the gate insulating layer 140 are disposed therebetween.

The semiconductor layer 154 includes a first semiconductor layer 154a and a second semiconductor layer 154b.

The first semiconductor layer 154a may include a lower semiconductor layer that is directly on the gate insulating layer 140. A lower surface of the first semiconductor layer 154a may contact the gate insulating layer 140 and a channel of the thin film transistor may be formed. An upper surface of the first semiconductor layer 154a may contact the second semiconductor layer 154b.

The second semiconductor layer 154b may be an upper semiconductor layer disposed on the first semiconductor layer 154a and be farther spaced apart from the gate electrode than the first semiconductor layer. A lower surface of the second semiconductor layer 154b may contact the first semiconductor layer 154a but is not limited thereto, and another semiconductor layer (not shown) may be disposed between the first semiconductor layer 154a and the second semiconductor layer 154b. At least one part of the upper surface of the second semiconductor layer 154b may respectively contact the source electrode 173 and the drain electrode 175.

The first semiconductor layer 154a and the second semiconductor layer 154b respectively include a semiconductor material, for example, an organic semiconductor material, for example, a low molecular organic semiconductor material. The first semiconductor layer 154a and the second semiconductor layer 154b may include for example a different organic semiconductor material from each other, for example, a different low molecular organic semiconductor material from each other. Herein, the low molecular organic semiconductor material may be an organic semiconductor material having an average molecular weight of greater than 0 and less than or equal to about 3,000.

The first semiconductor layer 154a may include a first organic semiconductor material and the second semiconductor layer 154b may include a second organic semiconductor material. The first organic semiconductor material and the second organic semiconductor material may have different electrochemical characteristics. For example, a redox potential of the first organic semiconductor material and a redox potential of the second organic semiconductor material may be different and, for example, a HOMO energy level of the first organic semiconductor material and a HOMO energy level of the second organic semiconductor material may be different.

The redox potential may be equal to energy required for electrochemically removing one electron from an HOMO potential, and thus the HOMO energy level may be obtained from the redox potential. For example, the HOMO energy level may be measured by relatively comparing a generally-known redox potential of an organic material and a measured redox potential of the organic material, for example, measured from an HOMO energy level (about 4.8 eV) of ferrocene/ferrocenium (Fc/Fc$^+$) as one reference material of the redox potential. Or, the HOMO energy level may be measured by manufacturing an organic semiconductor thin film and using an ultraviolet photoelectron spectroscopy.

For example, the redox potential of the second organic semiconductor material may be higher than the redox potential of the first organic semiconductor material. For example, the redox potential of the second organic semiconductor material may be at least about 0.1 eV higher than the redox potential of the first organic semiconductor material. For example, the redox potential of the second organic semiconductor material may be at least about 0.2 eV higher than the redox potential of the first organic semiconductor material.

For example, the HOMO energy level of the second organic semiconductor material may be higher than the HOMO energy level of the first organic semiconductor material, for example the HOMO energy level of the second organic semiconductor material may be at least about 0.1 eV higher than the HOMO energy level of the first organic semiconductor material, and for example the HOMO energy level of the second organic semiconductor material may be at least about 0.2 eV higher than the HOMO energy level of the first organic semiconductor material.

For example, the HOMO energy level of the second organic semiconductor material may be higher than the HOMO energy level of the first organic semiconductor material, and within the range, the HOMO energy level of the first organic semiconductor material may be about 4.8 eV to about 5.3 eV and the HOMO energy level of the second organic semiconductor material may be about 5.2 eV to about 5.6 eV. Within the ranges, for example, the HOMO energy level of the first organic semiconductor material may be about 4.8 eV to about 5.2 eV, the HOMO energy level of the second organic semiconductor material may be about 5.2 eV to about 5.5 eV, and within the range, for example the HOMO energy level of the first organic semiconductor material may be about 4.8 eV to about 5.1 eV and the HOMO energy level of the second organic semiconductor material may be about 5.2 eV to about 5.4 eV.

In this way, since the second semiconductor layer 154b has a relatively higher redox potential and HOMO energy level and thus is more stable about an electrochemical reaction such as an oxidation/a reduction during the subsequent process, and resultantly, may reduce or prevent a damage of an organic semiconductor material during the subsequent process and thus effectively protect the semiconductor layer 154, a high performance thin film transistor may be realized.

For example, charge mobility of a first organic semiconductor material may be higher than that of a second organic semiconductor material. Accordingly, the high performance thin film transistor may be realized by securing charge mobility of the first semiconductor layer 154a in which a channel of a thin film transistor is formed.

For example, at least one of the first and second semiconductor materials may be, for example, a fused polycyclic heteroaromatic compound including at least one of O, S, Se, Te, N, or a combination thereof, for example, a fused polycyclic heteroaromatic compound including at least one of S, Se, Te, or a combination thereof.

For example, the first and second organic semiconductor materials may be respectively a fused polycyclic heteroaromatic compound. The first and second organic semiconductor materials may be respectively for example, a fused polycyclic heteroaromatic compound including at least one of O, S, Se, Te, N, or a combination thereof, for example at least one of S, Se, Te, or a combination thereof.

For example, when the first and second organic semiconductor materials are respectively a fused polycyclic heteroaromatic compound, the first organic semiconductor material may have higher charge mobility than that of the second organic semiconductor material, for example, more fused rings than those of the second organic semiconductor material.

For example, the first organic semiconductor material may be for example a fused polycyclic heteroaromatic compound having compact planar structure wherein greater than or equal to about eight rings are fused, for example 8, 9, 10, 11, or 12 rings are fused.

The first organic semiconductor material may be for example represented by Chemical Formula 1A or 1B.

[Chemical Formula 1A]

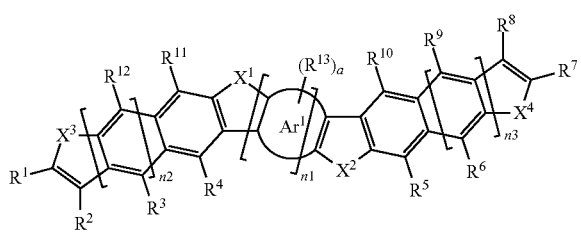

-continued

[Chemical Formula 1B]

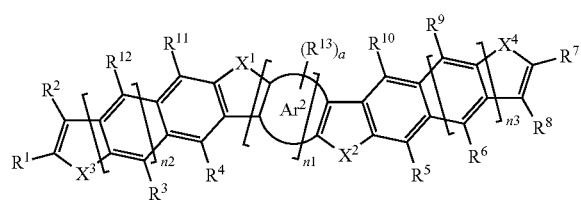

In Chemical Formulae 1 A and 1B, $Ar^1$ and $Ar^2$ are independently phenylene, naphthalene, or anthracene, and a corresponds to the number of hydrogen bound to carbon of $Ar^1$ and $Ar^2$, $X^1$ to $X^4$ are independently O, S, Se, Te, or N—$R^a$, wherein $R^a$ is independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C7 to C30 arylalkyl group, a substituted or unsubstituted C6 to C30 aryl group, a substituted or unsubstituted C1 to C30 alkoxy group, a substituted or unsubstituted C6 to C30 aryloxy group (—$OR^b$, wherein $R^b$ is a substituted or unsubstituted C6 to C30 aryl group), a substituted or unsubstituted C4 to C30 cycloalkyl group, a substituted or unsubstituted C4 to C30 cycloalkyloxy group (—$OR^c$, wherein $R^c$ is a substituted or unsubstituted C4 to C30 cycloalkyl group), a substituted or unsubstituted C2 to C30 heteroaryl group, acyl group (—C(=O)$R^d$, wherein $R^d$ is a substituted or unsubstituted C1 to C30 alkyl group), a sulfonyl group (—S(=O)$_2R^e$, wherein $R^e$ is a substituted or unsubstituted C1 to C30 alkyl group), or a carbamate group (—NHC(=O)O$R^f$, wherein $R^f$ is a substituted or unsubstituted C1 to C30 alkyl group), $R^1$ to $R^{13}$ are independently hydrogen, a substituted or unsubstituted C1 to C30 alkyl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heteroaryl group, a substituted or unsubstituted C7 to C30 arylalkyl group, a substituted or unsubstituted C2 to C30 heteroarylalkyl group, a substituted or unsubstituted C2 to C30 alkylheteroaryl group, a substituted or unsubstituted C5 to C30 cycloalkyl group, or a substituted or unsubstituted C2 to C30 heterocycloalkyl group, n1 is 0 or 1, n2 and n3 are independently 0, 1, 2, or 3, when n1 is 0, n2 and n3 are 1, 2, or 3, and when n1 is 1, n1+n2+n≥2.

For example, $R^1$ and $R^7$ may be substituted and may be for example a substituted or unsubstituted C1 to C30 alkyl group, a substituted or unsubstituted C6 to C30 aryl group, a substituted or unsubstituted C2 to C30 heteroaryl group, a substituted or unsubstituted C7 to C30 arylalkyl group, a substituted or unsubstituted C2 to C30 heteroarylalkyl group, a substituted or unsubstituted C2 to C30 alkylheteroaryl group, a substituted or unsubstituted C5 to C30 cycloalkyl group, or a substituted or unsubstituted C2 to C30 heterocycloalkyl group.

For example, $R^1$ and $R^7$ may be a fluoro substituted C1 to C30 alkyl group.

For example, $R^a$ may be a substituted or unsubstituted C10 to C30 alkyl group, a substituted or unsubstituted C10 to C30 alkoxy group, a substituted or unsubstituted C10 to C30 alkenyl group, or a substituted or unsubstituted C10 to C30 alkynyl group, for another example, a fluoro substituted C1 to C30 alkyl group, and desirably a C1 to C30 perfluoro alkyl group ($C_nF_{2n+1}$, wherein n is an integer of 1 or greater) or a fluoro substituted C10 to C30 alkyl group, and desirably a C10 to C30 perfluoro alkyl group ($C_nF_{2n+1}$, wherein n is an integer ranging from 10 to 30).

In Chemical Formulae 1A and 1B, when n1 is 0, n2 and n3 may be an integer of 1, 2, or 3 and when n1 is 1, n1+n2+n3 2, and for example when n1 is 1, both n2 and n3 may not be 0. The first organic semiconductor compound has this compact planar type molecular structure and thus sufficient packing and stacking among molecules as well as a uniform and stable oxidation potential and resultantly, may show high charge mobility.

In addition, in Chemical Formula 1A or 1B, $X^1$ and $X^2$, and $X^3$ and $X^4$ are respectively present in a symmetrical position each other and thus may improve the packing or stacking characteristics.

In addition, charge mobility and thermal stability of the fused polycyclic heteroaromatic compound may be improved by positioning at least one fused benzene ring between hetero rings in Chemical Formula 1A or 1B to expand a conjugation structure, and thus increase an interaction among molecules.

In addition, dissolubility of the fused polycyclic heteroaromatic compound in an organic solvent may be improved by positioning the hetero rings between the benzene rings.

The first organic semiconductor material may have for example an average molecular weight of about 300 to about 3,000.

The first organic semiconductor material may be for example the following compounds, but is not limited thereto.

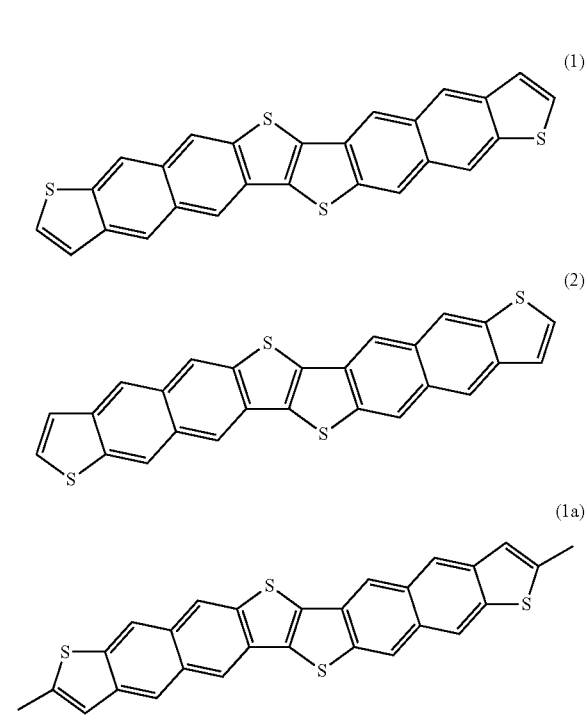

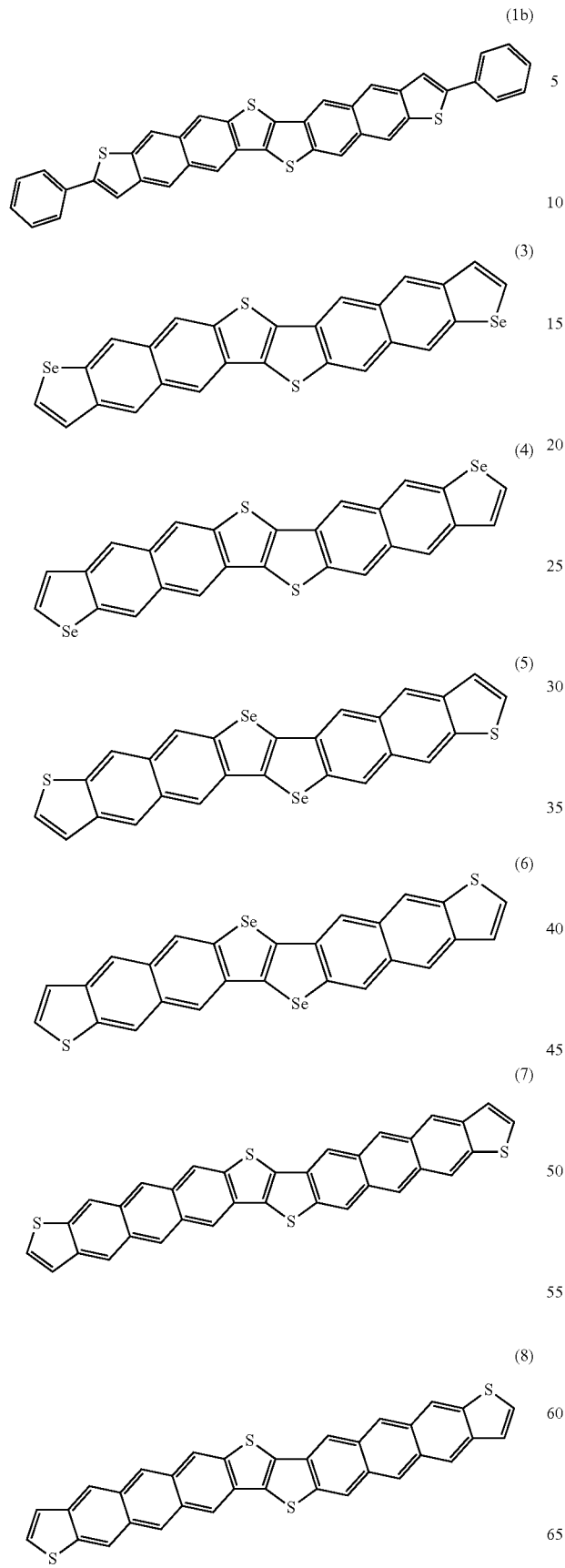
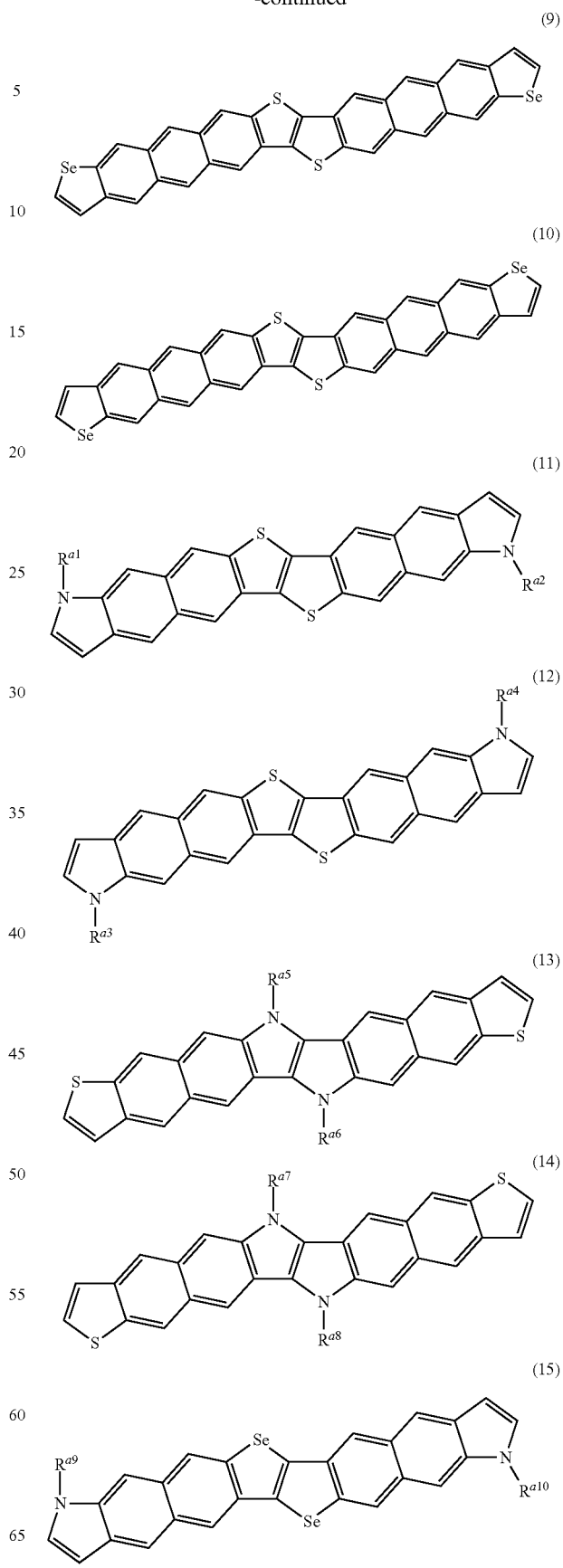

-continued
(16)
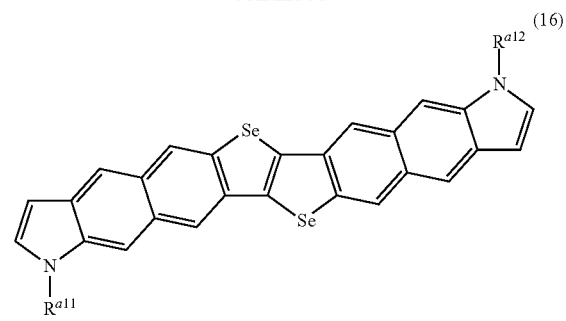
(17)
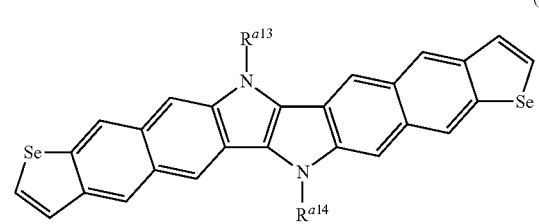
(18)
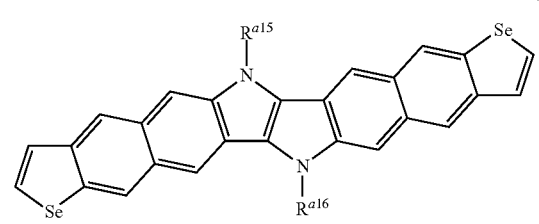
(19)
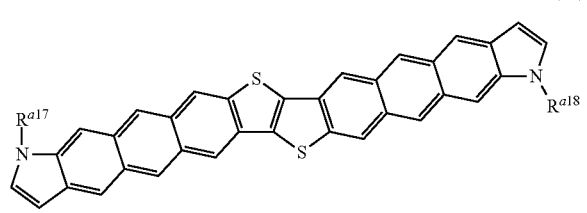
(20)
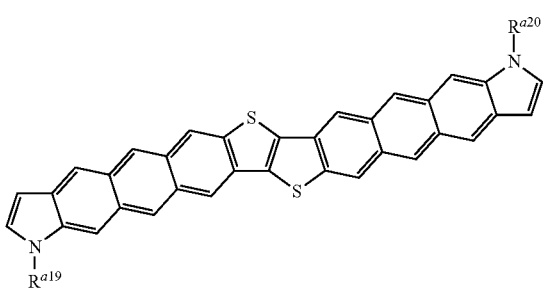
(21)
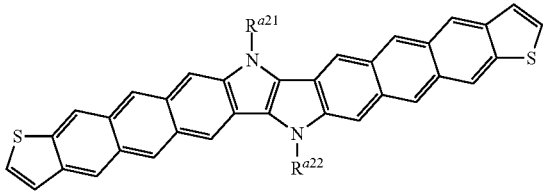
-continued
(22)
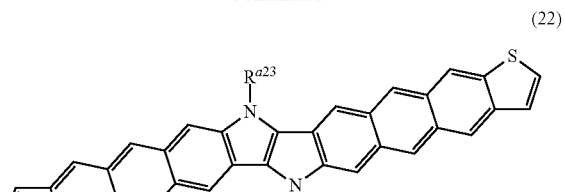
(23)
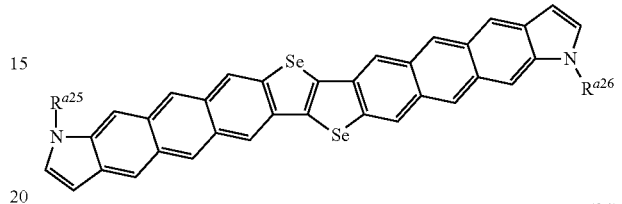
(24)
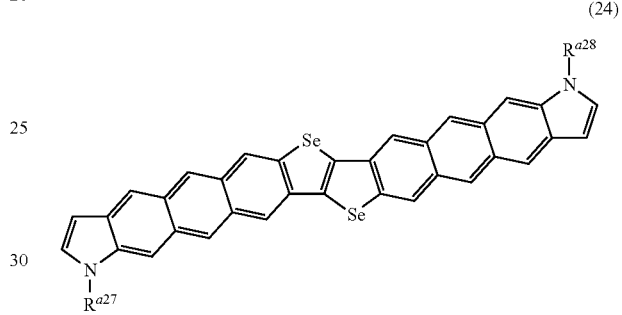
(25)
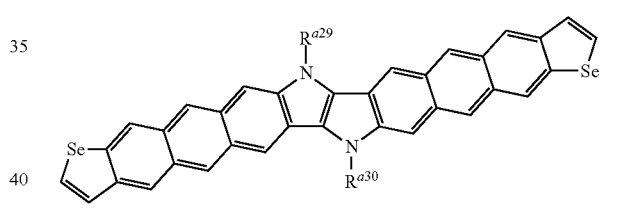
(26)
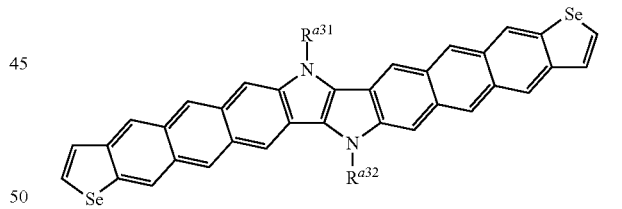
(27)
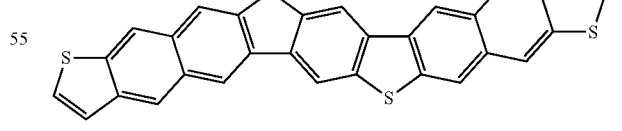
(28)
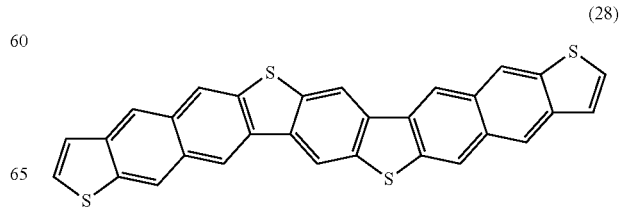

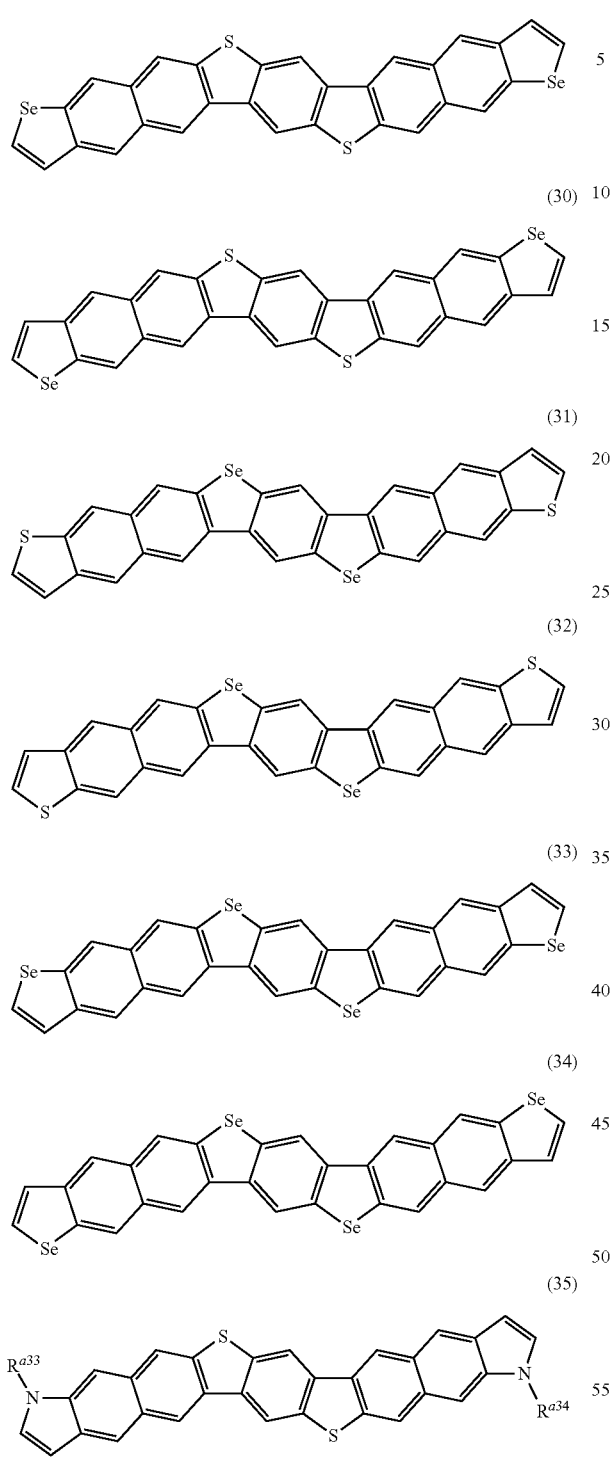
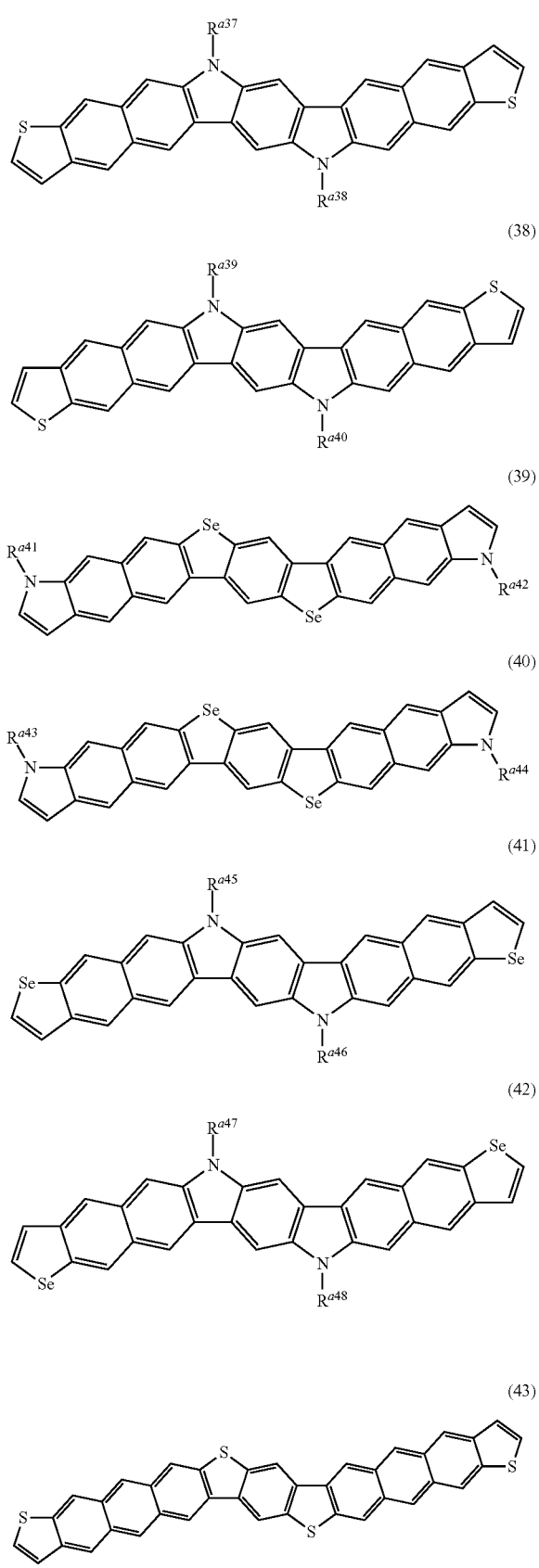

(44)
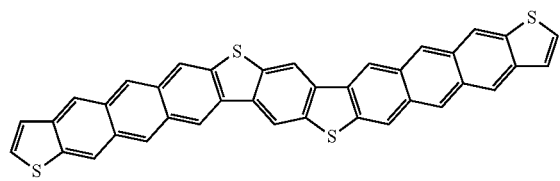
(45)
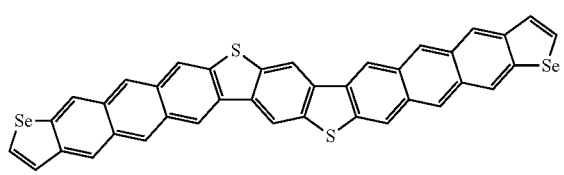
(46)
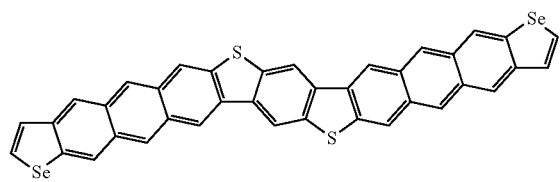
(47)
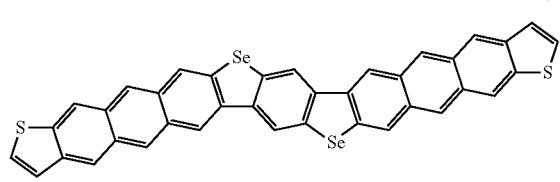
(48)
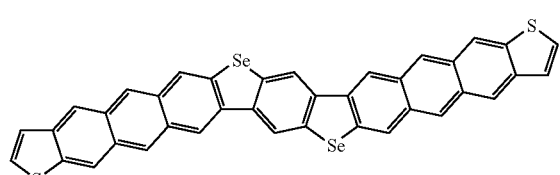
(49)
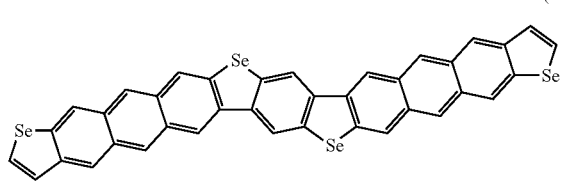
(50)
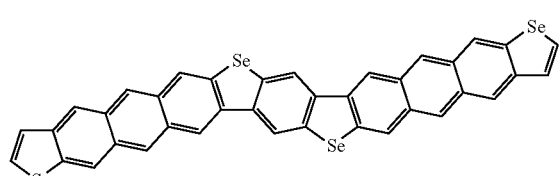
(51)
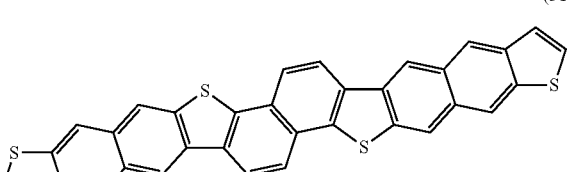
(52)
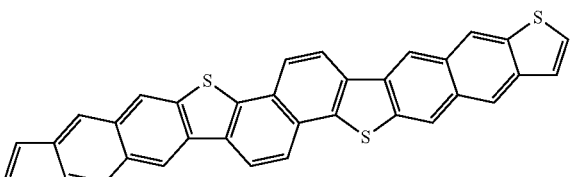
(53)
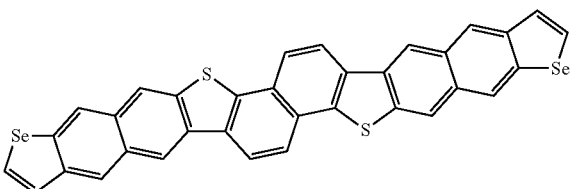
(54)
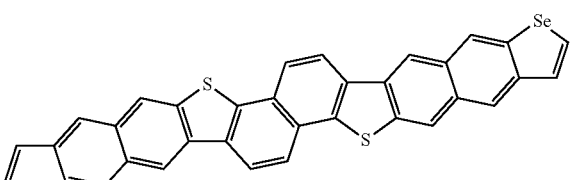
(55)
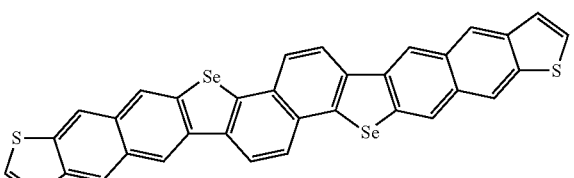
(56)
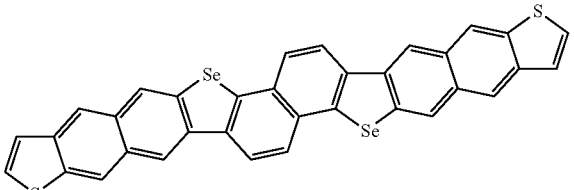
(57)
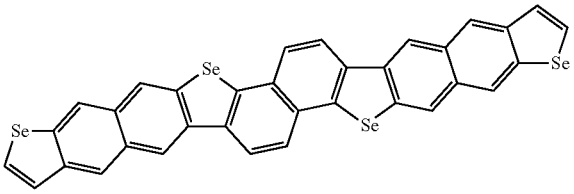
(58)
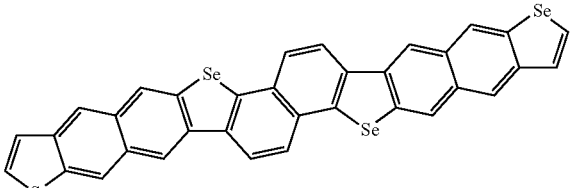

In the compounds, hydrogen of each phenylene ring, thiophene ring, selenophene ring, and/or pyrrole ring may be substituted by a substituted or unsubstituted C1 to C30 alkyl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heteroaryl group, a substituted or unsubstituted C7 to C30 arylalkyl group, a substituted or unsubstituted C2 to C30 heteroarylalkyl group, a substituted or unsubstituted C2 to C30 alkylheteroaryl group, a substituted or unsubstituted C5 to C30 cycloalkyl group, or a substituted or unsubstituted C2 to C30 heterocycloalkyl group.

For example, the second organic semiconductor material may be for example a fused polycyclic heteroaromatic compound wherein less than about eight rings are fused, for example 7, 6, 5, 4, or 3 rings are fused.

The second organic semiconductor material may be for example represented by Chemical Formula 2A or 2B.

[Chemical Formula 2A]

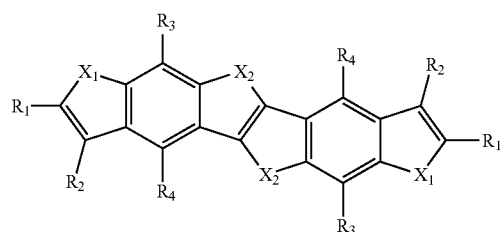

[Chemical Formula 2B]

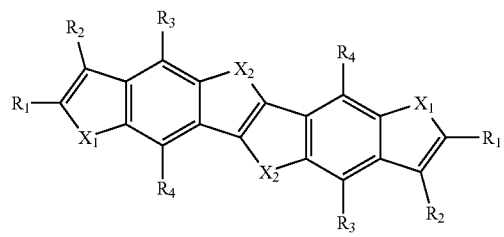

In Chemical Formulae 2A and 2B, $X^1$ and $X^2$ are independently O, S, Se, Te, or N—$R^a$, wherein $R^a$ is hydrogen, a substituted or unsubstituted C1 to C12 alkyl group, a substituted or unsubstituted C6 to C30 arylalkyl group, a substituted or unsubstituted C6 to C30 aryl group, a substituted or unsubstituted C1 to C12 alkoxy group, a substituted or unsubstituted C1 to C30 acyl group, a sulfonyl group, or a carbamate group, $R^1$ to $R^4$ are independently hydrogen, a substituted or unsubstituted C1 to C30 alkyl group, a substituted or unsubstituted C1 to C30 alkenyl group, a substituted or unsubstituted C1 to C30 alkynyl group, a substituted or unsubstituted C1 to C30 heteroalkyl group, a substituted or unsubstituted C6 to C30 arylalkyl group, a substituted or unsubstituted C2 to C30 heteroarylalkyl group, a substituted or unsubstituted C5 to C20 cycloalkyl group, a substituted or unsubstituted C2 to C30 heterocycloalkyl group, a substituted or unsubstituted C6 to C30 aryl group, or a substituted or unsubstituted C2 to C30 heteroaryl group.

The second organic semiconductor material may be for example represented by Chemical Formula 2A-1 or 2B-1.

[Chemical Formula 2A-1]

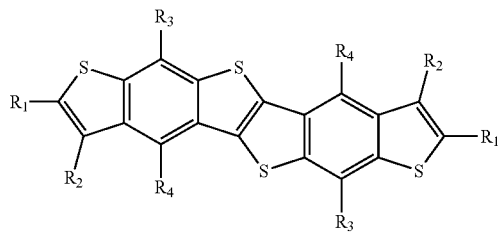

[Chemical Formula 2B-1]

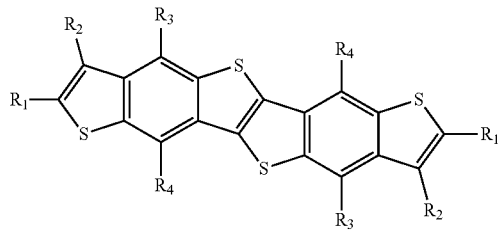

In Chemical Formulae 2A-1 and 2B-1, $R^1$ to $R^4$ are the same as above.

The second organic semiconductor material may have for example an average molecular weight of about 200 to about 2,000.

The second organic semiconductor material may be for example the following compounds, but is not limited thereto.

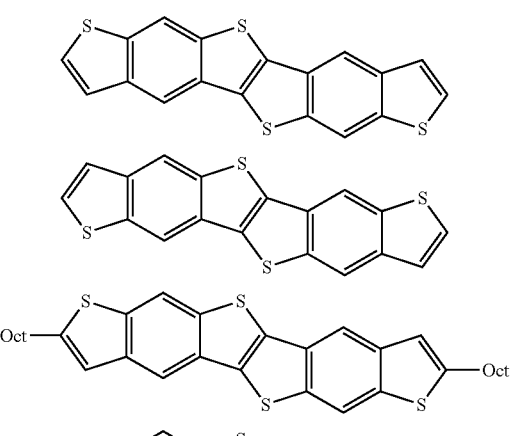

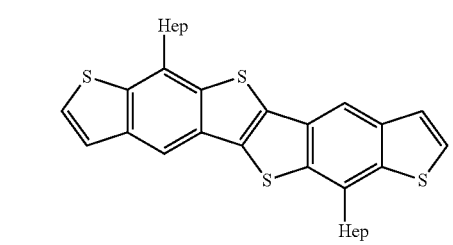

-continued

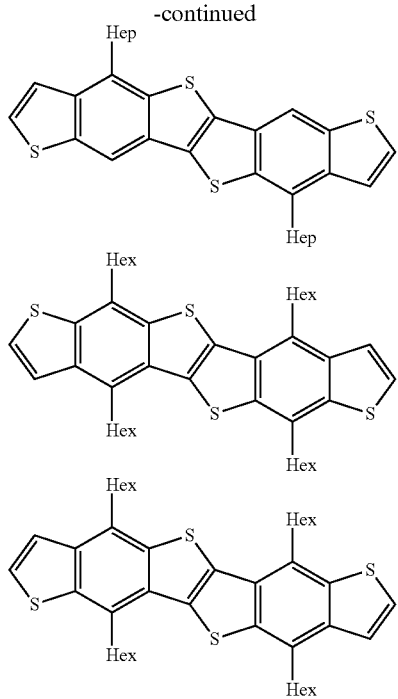

The first semiconductor layer 154a and the second semiconductor layer 154b may be respectively island-shaped and simultaneously, etched to have the same planar shape.

The first semiconductor layer and the second semiconductor layer may have a thickness of about 1 nanometer (nm) to about 5 micrometers (μm), respectively. Within the ranges, the first semiconductor layer and the second semiconductor layer may have for example about 5 nm to about 3 μm, for example about 10 nm to about 2 μm, for example about 20 nm to about 1 μm, for example about 50 nm to about 500 nm. For example, the first semiconductor layer may be thicker than the second semiconductor layer.

The source electrode 173 and the drain electrode 175 are formed on the semiconductor layer 154. The source electrode 173 and the drain electrode 175 face each other with the semiconductor layer 154 therebetween. The source electrode 173 is electrically connected to the data line (not shown) transferring the data signal. The source electrode 173 and the drain electrode 175 may be for example made of gold (Au), copper (Cu), nickel (Ni), aluminum (Al), molybdenum (Mo), chromium (Cr), tantalum (Ta), titanium (Ti), an alloy thereof or a combination thereof, but are not limited thereto. The source electrode 173 and the drain electrode 175 may include for example one layer or two or more layers.

Hereinafter, a method of manufacturing the thin film transistor according to some example embodiments is described.

FIGS. 2 to 10 are cross-sectional views showing a manufacturing method of the thin film transistor of FIG. 1.

Figure 2:
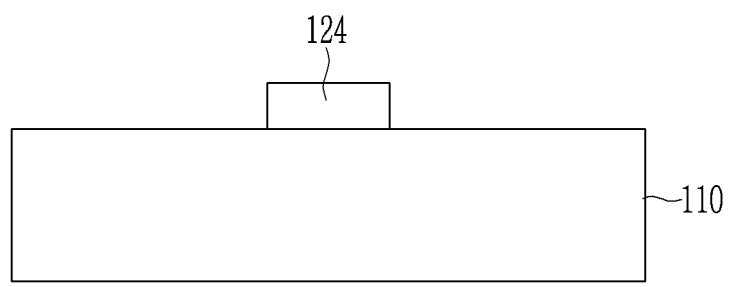
FIGS. 2 to 10 are cross-sectional views showing a manufacturing method of the thin film transistor of FIG. 1.

Referring to FIG. 2, a conductive layer (not shown) for a gate electrode is deposited on a substrate 110 and treated (e.g., patterned) using photolithography to form a gate electrode 124.

Figure 3:
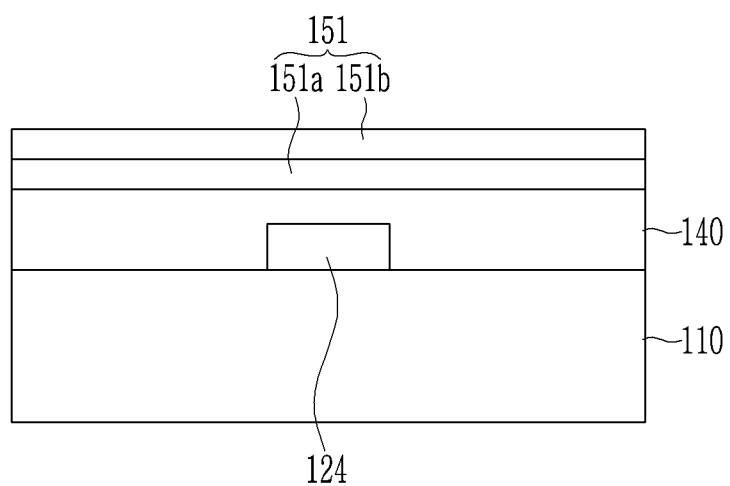

Next, referring to FIG. 3, a gate insulating layer 140 is formed by laminating silicon oxide ($SiO_2$), silicon nitride (SiNx), aluminum oxide ($Al_2O_3$), or an organic insulator on the gate electrode 124. Optionally, the gate insulating layer 140 may be surface-treated.

Subsequently, a first semiconductor thin film 151a and a second semiconductor thin film 151b are sequentially deposited on the gate insulating layer 140. The first semiconductor thin film 151a may include a first organic semiconductor material, and the second semiconductor thin film 151b may include a second organic semiconductor material. The first and second organic semiconductor materials are the same as described above. The first semiconductor thin film 151a and the second semiconductor thin film 151b may be for example formed through a deposition such as a thermal deposition, a vacuum deposition, or a laser deposition, or a solution process such as screen printing, printing, imprinting, spin casting, dipping, Inkjet printing, roll coating, drop casting, spray coating, or roll printing but is not limited thereto.

Figure 4:
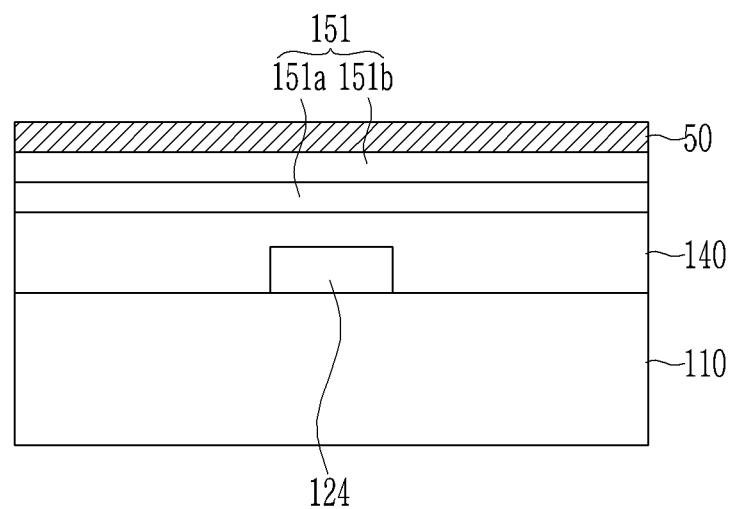

Subsequently, referring to FIG. 4, a photoresist film 50 is formed by coating a photoresist on the second semiconductor thin film 151b. The photoresist may be for example a photoresist including a fluorine-based compound such as a fluorine-based polymer, but is not limited thereto.

Figure 5:
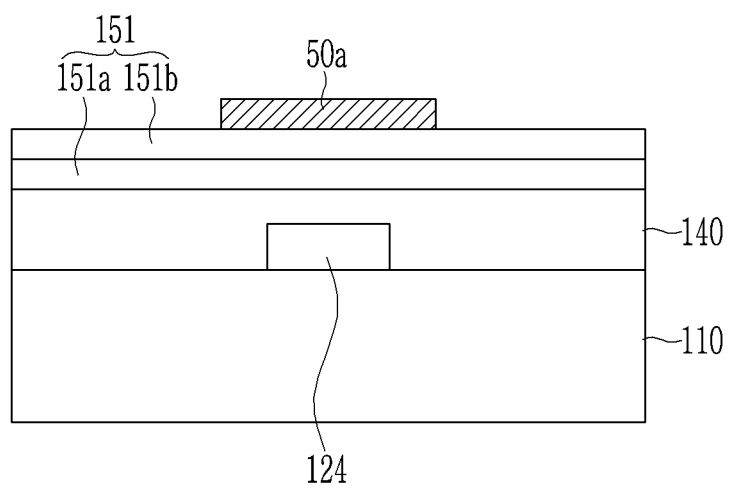

Then, referring to FIG. 5, a mask (not shown) is disposed on the photoresist film 50, and then, the photoresist film 50 is exposed to light and developed to form a photoresist pattern 50a.

Figure 6:
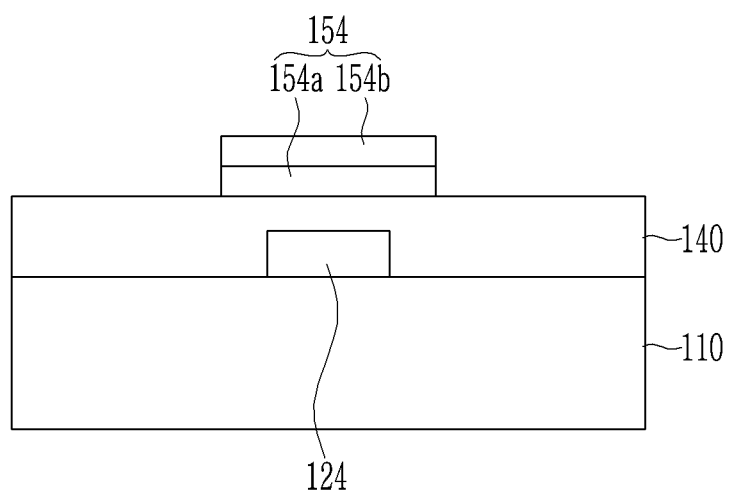

Subsequently, referring to FIG. 6, the photoresist pattern 50a is used as a mask to simultaneously etch both the first semiconductor thin film 151a and the second semiconductor thin film 151b and thus form a first semiconductor layer 154a and a second semiconductor layer 154b. Herein, the etching may be, for example, dry etching. Subsequently, the photoresist pattern 50a may be removed.

Figure 7:
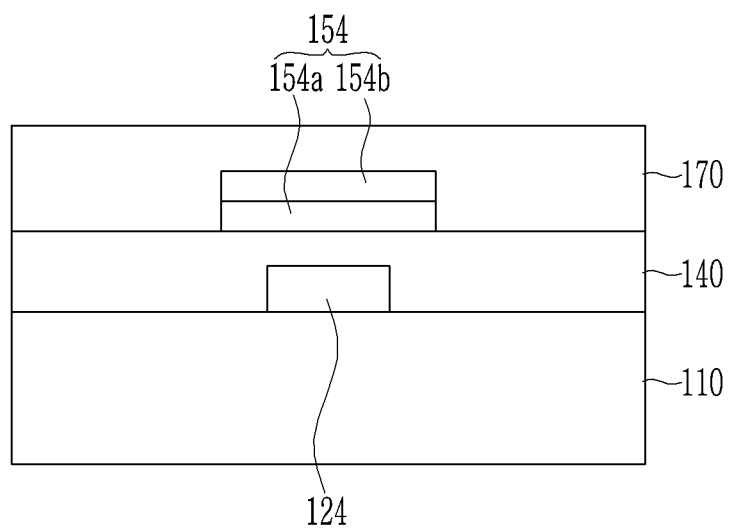

Then, referring to FIG. 7, a conductive layer 170 for source and drain electrodes is deposited on the second semiconductor layer 154b. The conductive layer 170 for source and drain electrodes may for example include gold (Au), copper (Cu), nickel (Ni), aluminum (Al), molybdenum (Mo), chromium (Cr), tantalum (Ta), titanium (Ti), an alloy thereof, or a combination thereof and may be one layer or two or more layers.

Figure 8:
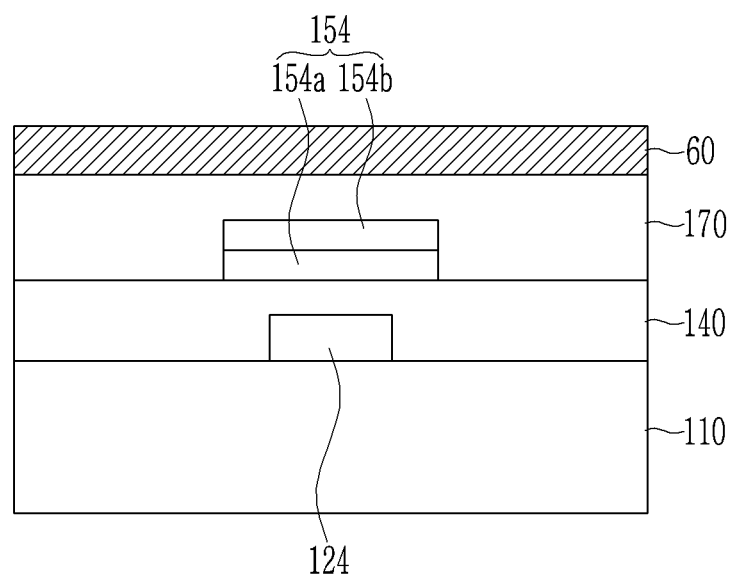

Subsequently, referring to FIG. 8, a photoresist is coated on the conductive layer 170 for source and drain electrodes to form a photoresist film 60. The photoresist may for example be a fluorine-based photoresist including a fluorine-based compound such as a fluorine-based polymer, but is not limited thereto.

Figure 9:
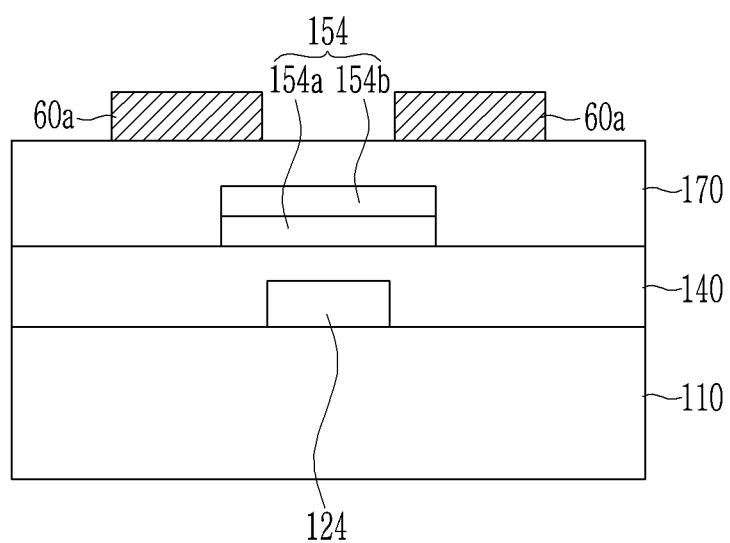

Subsequently, referring to FIG. 9, a mask (not shown) is disposed on the photoresist film 60, and then, the photoresist film 60 is exposed to light and developed to form a photoresist pattern 60a.

Figure 10:
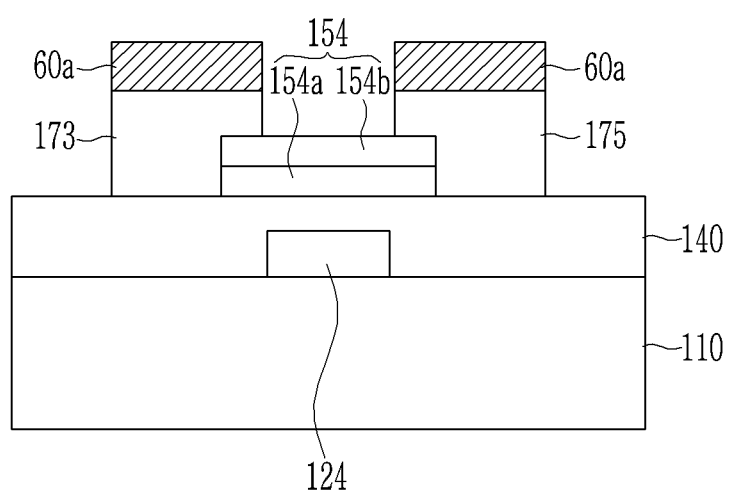

Then, referring to FIG. 10, the conductive layer 170 for source and drain electrodes is etched by supplying an etching solution (hereinafter, referred to be an 'etching solution') on the photoresist pattern 60a.

The etching may include an electrochemical reaction of oxidizing a metal included in the conductive layer 170 for source and drain electrodes and simultaneously reducing a component included in the etching solution. For example, when the etching solution is a gold (Au) etching solution (including $I_3^-$), the etching may include an oxidation of a metal, $Au = Au^+ + e^-$ and a reduction of the etching solution, $I_3^- + 2e^- = 3I^-$. The etching solution directly contacts the upper surface of the second semiconductor layer 154b as well as the conductive layer 170 for source and drain electrodes, and thus the second semiconductor layer 154b may desirably be stable to the oxidation of the etching solution.

For example, the redox potential of the second organic semiconductor material included in the second semiconductor layer 154b may be higher than that of the etching solution, and the HOMO energy level of the second organic semiconductor material included in the second semiconductor layer 154b may be higher than the redox potential of the etching solution. For example, when the etching solution is a gold (Au) etching solution (including $I_3^-$), and the redox potential of $I_3^-$ is about 5.1 eV, the HOMO energy level of the second organic semiconductor material included in the second semiconductor layer 154b may be higher than about 5.1 eV.

For example, the HOMO energy level of the second organic semiconductor material is higher than the redox potential of the etching solution but may be less than or equal to about 5.6 eV. For example, the HOMO energy level of the second organic semiconductor material may be in a range of about 5.2 to about 5.6 eV, for example, about 5.2 to about 5.5 eV, for example, about 5.2 to about 5.4 eV within the range.

Accordingly, an oxidation of the second semiconductor layer 154b exposed to the etching solution may be suppressed or prevented to reduce or prevent a damage on the semiconductor layer 154. Therefore, a high performance thin film transistor may be realized by decreasing a leakage current of a thin film transistor due to the damage of the semiconductor layer 154.

The first semiconductor layer 154a does not directly contact the etching solution and thus may not be related to the redox potential of the etching solution. For example, the HOMO energy level of the first organic semiconductor material included in the first semiconductor layer 154a may satisfy high charge mobility. For example, the HOMO energy level of the first organic semiconductor material included in the first semiconductor layer 154a may be lower than the redox potential of the etching solution, for example, greater than or equal to about 4.8 eV and lower than the oxidation potential of the etching solution. For example, the HOMO energy level of the first organic semiconductor material may be in a range of about 4.8 eV to about 5.3 eV, for example, within the range, about 4.8 to about 5.2 eV, about 4.8 to about 5.1 eV, and greater than or equal to about 4.8 and less than about 5.1 eV.

Then, referring to FIG. 1, a source electrode 173 and a drain electrode 175 are formed by removing the photoresist pattern 60a.

Although an example of a bottom-gate thin film transistor having has been described, inventive concepts are not limited thereto, and may be applied to all thin film transistors (e.g., top gate thin film transistors, dual-gate transistors, etc.).

The thin film transistor may be applied to a switch or driving device of various electronic devices, and the electronic device may be, for example, a liquid crystal display (LCD), an organic light emitting diode (OLED) display, an electrophoretic display device, an organic sensor, or a wearable device.

Hereinafter, the embodiments are illustrated in more detail with reference to examples. However, these examples are non-limiting examples, and inventive concepts are not limited thereto.

Manufacture of Thin Film Transistor

EXAMPLE 1

A 500 Å-thick first semiconductor thin film is formed on a silicon wafer substrate covered with $SiO_2$ to be 3000 Å thick by vacuum-depositing an organic semiconductor represented by Chemical Formula A (HOMO: 4.9 eV), and a 100 Å-thick second semiconductor thin film is formed thereon by vacuum-depositing an organic semiconductor represented by Chemical Formula B (HOMO: 5.3 eV) thereon. Subsequently, a fluorine-based photoresist is coated on the second semiconductor thin film and then, cured and patterned to form a photoresist pattern. Then, the photoresist pattern is used to dry-etch the second semiconductor thin film and the first semiconductor thin film together at once and thus form a semiconductor layer including the first semiconductor layer and the second semiconductor layer. Subsequently, the photoresist pattern is removed. Then, gold (Au) is deposited on the second semiconductor layer to form a conductive layer, and then, a fluorine-based photoresist is coated thereon and then, cured and patterned to form a photoresist pattern. Subsequently, the substrate is dipped in an Au etching solution (Au-10, U.P. Chemical Co., Oxidation potential of 5.1 eV) and taken out to etch the conductive layer and thus form a source electrode and a drain electrode. Subsequently, the photoresist pattern is removed to manufacture a thin film transistor.

[Chemical Formula A]

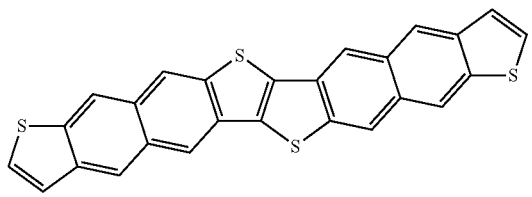

[Chemical Formula B]

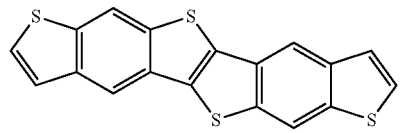

COMPARATIVE EXAMPLE 1

A thin film transistor is manufactured according to the same method as Example 1 except for forming only the first semiconductor layer including an organic semiconductor represented by Chemical Formula A without forming the second semiconductor layer as a semiconductor layer.

Evaluation

Charge mobility and current characteristics of the thin film transistors according to Example 1 and Comparative Example 1 are evaluated.

The charge mobility may be obtained from a slope of a graph having variables of $(I_{SD})^{1/2}$ and $V_G$, which is obtained from a saturation region current formula.

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

-continued $$\mu_{FRT} = (\text{slope})^2 \frac{2L}{C_0 W}$$

In the equations, $I_{SD}$ is a source-drain current, $\mu$ or $\mu_{FET}$ is the charge mobility, $C_0$ is electrostatic capacity of a gate insulating layer, W is a channel width, L is a channel length, $V_G$ is a gate voltage, and $V_T$ is a threshold voltage.

The current characteristics may be evaluated as a ratio of an On-current ($I_{on}$) and an Off-current ($I_{off}$), and herein, the On-current ($I_{on}$) may be obtained from a maximum current in a driving gate voltage and a source-drain voltage, and the Off-current ($I_{off}$) may be obtained from a current in an off-state while the thin film transistors are driven by a positive gate voltage.

The results are shown in Table 1.

TABLE 1

|  | Charge mobility (cm²/Vs) | $I_{on}/I_{off}$ |
|---|---|---|
| Example 1 | 9.7 | $4.4 \times 10^{10}$ |
| Comparative Example 1 | 5.0 | $4.5 \times 10^2$ |

Referring to Table 1, the thin film transistor according to Example 1 shows higher charge mobility and more improved current characteristics than the thin film transistor according to Comparative Example 1.

While this disclosure has been described in connection with what is presently considered to be practical example embodiments, it is to be understood that the scope to be claimed is not limited to the disclosed embodiments, but, on the contrary, is intended to cover various modifications and equivalent arrangements included within the spirit and scope of the appended claims.

What is claimed is:

1. A thin film transistor comprising
a gate electrode,
a semiconductor layer overlapping with the gate electrode, the semiconductor layer including a first semiconductor layer and a second semiconductor layer, the first semiconductor layer including a first organic semiconductor material, the second semiconductor layer being farther spaced apart from the gate electrode than the first semiconductor layer, the second semiconductor layer including a second organic semiconductor material, and
a HOMO energy level of the second organic semiconductor material being different from a HOMO energy level of the first organic semiconductor material; and
a source electrode and a drain electrode that are electrically connected to the semiconductor layer, the semiconductor layer being entirely between the source electrode and the drain electrode, and the first semiconductor layer and the second semiconductor layer both directly contacting the source electrode and the drain electrode.

2. The thin film transistor of claim 1, wherein the HOMO energy level of the second organic semiconductor material is higher than the HOMO energy level of the first organic semiconductor material.

3. The thin film transistor of claim 2, wherein the HOMO energy level of the second organic semiconductor material is at least about 0.2 eV higher than the HOMO energy level of the first organic semiconductor material.

4. The thin film transistor of claim 2, wherein
the HOMO energy level of the first organic semiconductor material is about 4.8 eV to about 5.3 eV, and
the HOMO energy level of the second organic semiconductor material is about 5.2 eV to about 5.6 eV.

5. The thin film transistor of claim 1, wherein the first semiconductor layer is thicker than the second semiconductor layer.

6. The thin film transistor of claim 1, wherein the source electrode and the drain electrode contact an upper surface of the second semiconductor layer.

7. The thin film transistor of claim 1, further comprising:
a gate insulating layer between the gate electrode and the semiconductor layer, wherein
a lower surface of the first semiconductor layer contacts the gate insulating layer.

8. The thin film transistor of claim 1, wherein the first semiconductor layer and the second semiconductor layer have a same planar shape.

9. The thin film transistor of claim 1, wherein a charge mobility of the first organic semiconductor material is higher than a charge mobility of the second organic semiconductor material.

10. The thin film transistor of claim 1, wherein the first organic semiconductor material and the second organic semiconductor material each include a fused polycyclic heteroaromatic compound.

11. The thin film transistor of claim 10, wherein
the fused polycyclic heteroaromatic compound of the first organic semiconductor material includes 8 or more fused rings, and
the fused polycyclic heteroaromatic compound of the second organic semiconductor material includes less than 8 fused rings.

12. An electronic device comprising:
the thin film transistor of claim 1.

13. A method of manufacturing a thin film transistor, comprising
forming a gate electrode;
forming a semiconductor layer, wherein the forming of the semiconductor layer includes,
forming a first semiconductor layer including a first organic semiconductor material, and
forming a second semiconductor layer including a second organic semiconductor material on the first semiconductor layer, a HOMO energy level of the second organic semiconductor material being different from a HOMO energy level of the first organic semiconductor material; and
forming a source electrode and a drain electrode connected to the first and second semiconductor layers of the semiconductor layer, the semiconductor layer being entirely between the source electrode and the drain electrode, the source electrode and the drain electrode both being in direct contact with the first and second semiconductor layers.

14. The method of claim 13, wherein the HOMO energy level of the second organic semiconductor material is higher than the HOMO energy level of the first organic semiconductor material.

15. The method of claim 14, wherein the HOMO energy level of the second organic semiconductor material is at least about 0.2 eV higher than the HOMO energy level of the first organic semiconductor material.

16. The method of claim 14, wherein
the HOMO energy level of the first organic semiconductor material is about 4.8 eV to about 5.3 eV, and the HOMO energy level of the second organic semiconductor material is about 5.2 eV to about 5.6 eV.

17. The method of claim 13, wherein
the forming the source electrode and the drain electrode is performed after the forming the semiconductor layer,
the forming the source electrode and the drain electrode includes,
　forming a conductive layer on the second semiconductor layer, and
　etching the conductive layer using an etching solution to from the source electrode and the drain electrode, and
the HOMO energy level of the second organic semiconductor material is higher than an oxidation potential of the etching solution.

18. The method of claim 17, wherein
the HOMO energy level of the second organic semiconductor material is higher than the oxidation potential of the etching solution, and
the HOMO energy level of the second organic semiconductor material less than or equal to about 5.6 eV.

19. The method of claim 17, wherein the HOMO energy level of the first organic semiconductor material is lower than the oxidation potential of the etching solution.

20. The method of claim 19, wherein
the HOMO energy level of the first organic semiconductor material is higher than or equal to about 4.8 eV, and
the HOMO energy level of the first organic semiconductor material is lower than the oxidation potential of the etching solution.

21. The method of claim 13, wherein the forming of the semiconductor layer includes:
　forming a first thin film for the first semiconductor layer,
　forming a second thin film for the second semiconductor layer, and etching the first thin film and the second thin film simultaneously.

* * * * *